US007017134B2

(12) United States Patent
Saito et al.

(10) Patent No.: US 7,017,134 B2
(45) Date of Patent: Mar. 21, 2006

(54) AUTOMATIC FLOOR-PLANNING METHOD CAPABLE OF SHORTENING FLOOR-PLAN PROCESSING TIME

(75) Inventors: Ken Saito, Tokyo (JP); Yoshio Inoue, Tokyo (JP); Koji Hirakimoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/836,324

(22) Filed: May 3, 2004

(65) Prior Publication Data

US 2004/0228167 A1 Nov. 18, 2004

(30) Foreign Application Priority Data

May 8, 2003 (JP) ............................ 2003-130157

(51) Int. Cl.
*G06F 17/50* (2006.01)

(52) U.S. Cl. ................................ 716/10; 716/8; 716/9

(58) Field of Classification Search .............. 716/8–11
See application file for complete search history.

(56) References Cited

U.S. PATENT DOCUMENTS 5,999,716 A * 12/1999 Toyonaga .................... 716/10
6,012,155 A * 1/2000 Beausang et al. ........... 714/727
6,141,790 A * 10/2000 Beausang et al. .............. 716/5
6,442,743 B1 * 8/2002 Sarrafzadeh et al. .......... 716/10
6,704,916 B1 * 3/2004 Nishida et al. ............... 716/10
2001/0039641 A1 * 11/2001 Chang et al. .................. 716/8
2002/0138816 A1 * 9/2002 Sarrafzadeh et al. .......... 716/11
2004/0139413 A1 * 7/2004 DeHon et al. ................. 716/9

FOREIGN PATENT DOCUMENTS

JP HEI 6-204437 7/1994

* cited by examiner

*Primary Examiner*—Matthew Smith
*Assistant Examiner*—Naum Levin
(74) *Attorney, Agent, or Firm*—Leydig, Voit & Mayer, Ltd.

(57) ABSTRACT

An automatic floor-planning method includes extracting a register and a logic operation cell in a semiconductor integrated-circuit unit, extracting a first register set and a second register set that are assumed to input and receive a signal to and from the logic operation cell directly or via other logic operation cell, respectively, creating a set of the logic operation cells as a cluster cell, determining a layout of the cluster cell and the register, selecting a logic level block for which a floor plan is performed, and determining an arrangement and wiring area such that the arrangement and wiring area of the logic level block includes as many cells as possible that belong to the logic level block.

14 Claims, 11 Drawing Sheets

AUTOMATIC FLOOR-PLANNING METHOD CAPABLE OF SHORTENING FLOOR-PLAN PROCESSING TIME

BACKGROUND OF THE INVENTION

1) Field of the Invention

The present invention relates to an automatic floor-planning method for efficiently determining a floor plan for a circuit arrangement in a semiconductor (IC) unit.

2) Description of the Related Art

In recent years, with the advancement of technology of scaling-down to micro, there is a tendency to increase the number of cells that can be installed in one chip. With an increase in the number of cells, a layout design of a semiconductor IC unit, which is called as a floor plan, is getting more and more complicated and gaining importance. Therefore, it is desirable that the floor plan of the semiconductor IC unit is made easily in short time thereby shortening the period of time for designing the semiconductor IC unit.

In the designing of the semiconductor IC unit, floor planning is performed after finishing logic designing. In a conventional method of determining the floor plan, to start with, an area on a chip is determined for each logic level block and a method of level designing in which the logic level blocks are designed in respective areas, is adopted.

In such a method of level designing, a computer is allowed to read circuit-connection information and library data. The circuit-connection information includes information, in which information of logic level block and information of connection between cell terminals are defined. The information of logic level block is information of level blocks that include sets of cells. The library data includes information such as chip-substrate information and cell-structure information. The chip-substrate information includes information of silicon substrate on which the semiconductor IC unit is formed. The cell-structure information includes information of cell structure etc. about physical structure (size, shape) of the cell. After reading the library data, a designer selects a logic level block for which the floor planning is to be performed and determines an arrangement and wiring area (layout area) of the logic level block that is selected.

Arrangement of cells and wiring between the terminals of the cells are performed in the arrangement and wiring area of the logic level block. Further, simulation (testing of circuit operation) is carried out based on the final arrangement and wiring, and the floor planning is performed repeatedly to revise the arrangement and the wiring area, whenever there is a delay.

However, since the designer determines the arrangement and wiring area of the level block in such a method of determining the floor plan, depending on the simulation results, the floor plan has to be re-executed quite a few times and the designing takes longer time. To shorten the designing time, it is desirable that the re-execution of the arrangement and wiring area of the level block is reduced by making the floor plan easy.

In a method of determining the floor plan according to Japanese Patent Laid-open Publication No. H6-204437, first of all, grouping is carried out for each of those cells which realize the same function. Further, wiring between the groups is determined virtually and simulation of function is performed based on the wiring between the groups. Driving cells with insufficient driving capability are changed. Thus, the re-execution (frequency of arrangement and wiring) of the floor plan is reduced.

However, according the conventional technology, when the driving capability of the driving cells is insufficient, for changing the driving cells before the logic simulation, a large number of driving cells are required to be changed. Moreover, only changing the driving cells is not sufficient to reduce the frequency of re-execution of the floor plan.

SUMMARY OF THE INVENTION

It is an object of the present invention to solve at least the problems in the conventional technology.

The automatic floor-planning method according to one aspect of the present invention includes extracting a register and a logic operation cell in a semiconductor integrated-circuit unit to be designed, extracting a first register set that is assumed to input a signal to the logic operation cell directly or via other logic operation cell and a second register set that is assumed to receive a signal from the logic operation cell directly or via the other logic operation cell, creating a set of the logic operation cells as a cluster cell, based on a result of extracting the first register set and the second register set, determining a layout of the cluster cell and the register such that the logic operation cells in the cluster cell are arranged closely, selecting a logic level block, for which a floor plan is performed, from among arbitrary logic level blocks that are formed by a set of the register and the logic operation cells in the semiconductor integrated-circuit unit, and determining an arrangement and wiring area, based on a result of the selecting, such that the arrangement and wiring area of the logic level block selected includes as many cells as possible that belong to the logic level block.

The other objects, features, and advantages of the present invention are specifically set forth in or will become apparent from the following detailed description of the invention when read in conjunction with the accompanying drawings.

DETAILED DESCRIPTION

Exemplary embodiments of an automatic floor-planning method according to the present invention are described below in detail with reference to the accompanying drawings. However, the present invention is not limited only to the embodiments described below.

Figure 1:
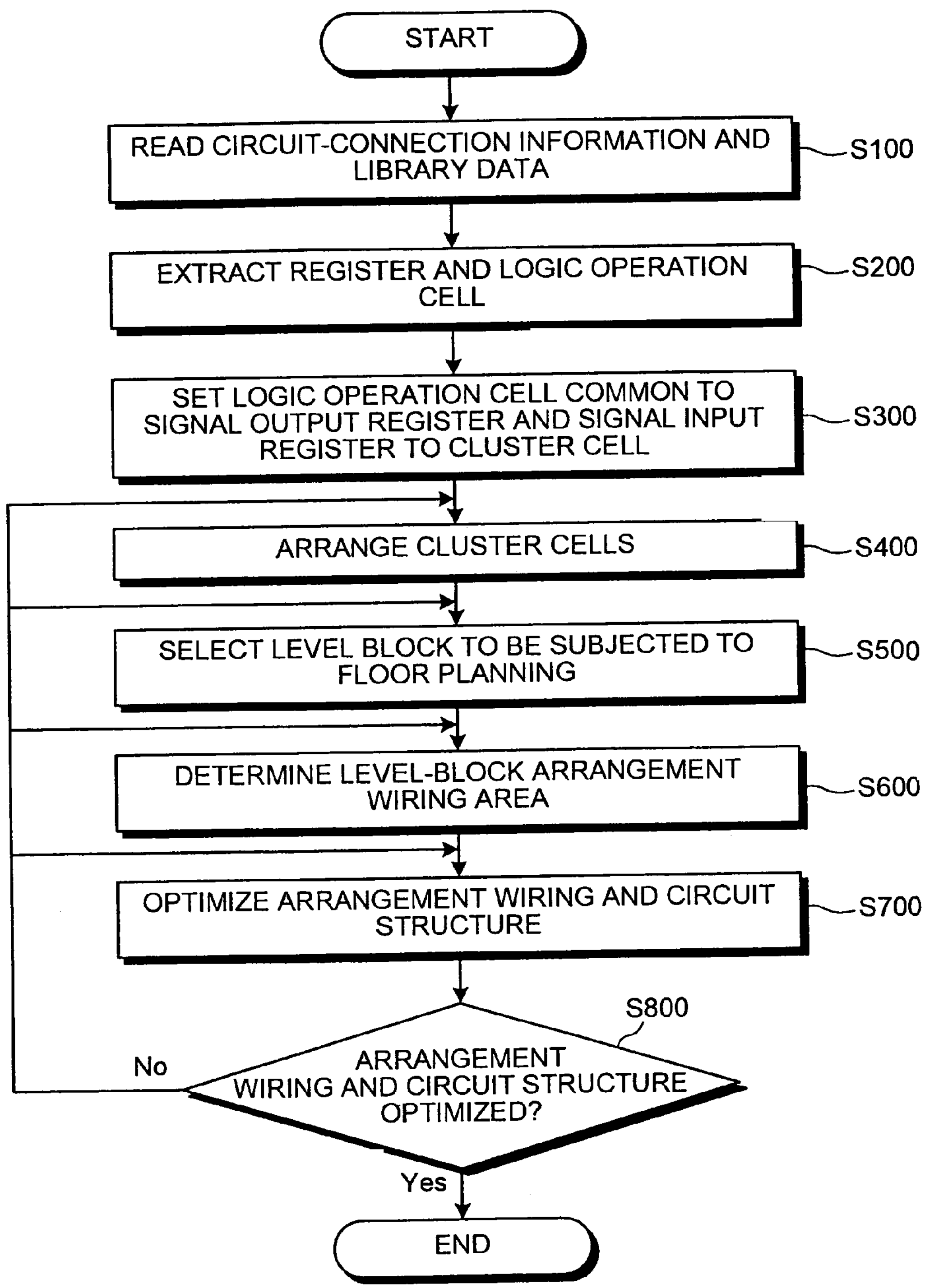
FIG. 1 is a flowchart of an automatic floor-planning process according to a first embodiment of the present invention.

FIG. 1 is a flowchart of an automatic floor-planning process according to a first embodiment of the present invention.

A personal computer (PC) that executes a floor plan reads circuit-connection information and library data. The circuit-connection information includes information, in which information of logic level block and information of connection between cell terminals are defined. The information of logic level block is information of level blocks that include sets of cells. The library data includes information such as chip-substrate information and cell-structure information. The chip-substrate information includes information of silicon substrate on which the semiconductor IC unit is formed. The cell-structure information includes information of cell structure etc. about a physical structure (size, shape) of the cell (step S100).

Logic operation cells that are included in a register and logic circuit which hold data temporarily are extracted from the circuit-connection information. Input and output cells that input and output signals of external and internal circuits of the semiconductor IC unit are considered as register cells and are extracted together with the register (step S200)

Figure 2:
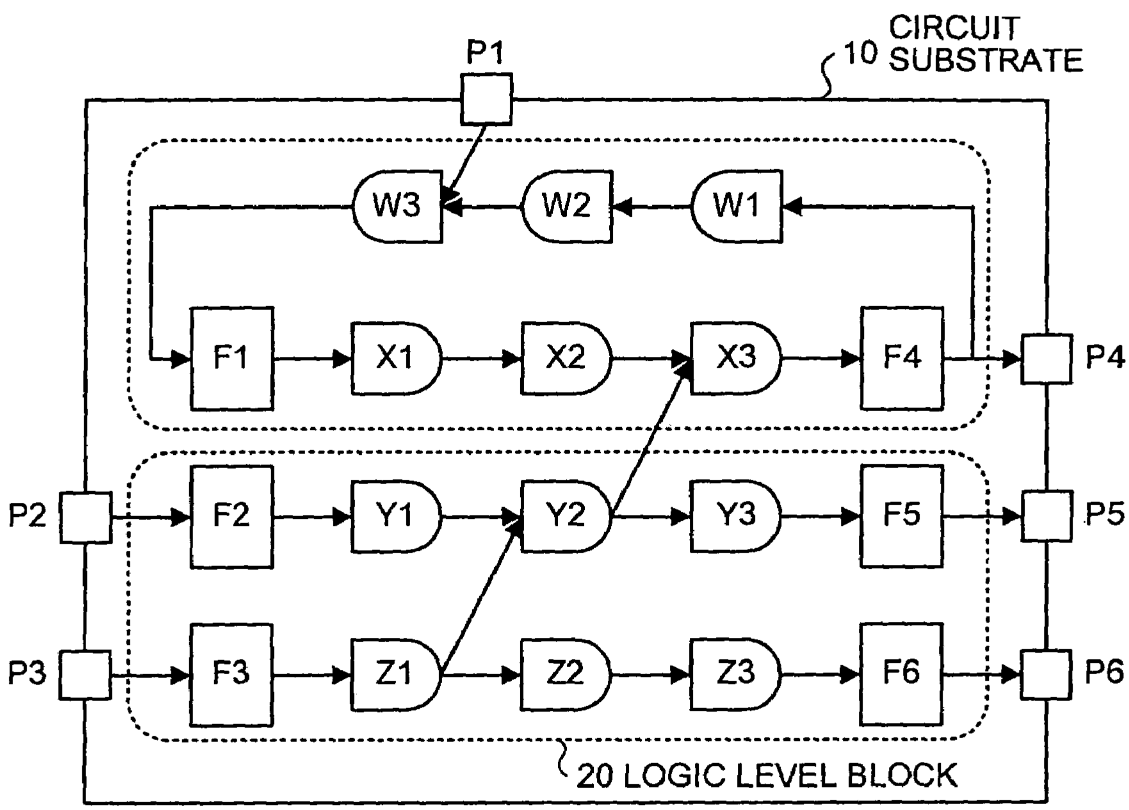
FIG. 2 is a circuit diagram for illustrating an example of a layout according to the first embodiment.

At step S100, the register and the logic operation cell shown in FIG. 2 are extracted. FIG. 2 is a circuit diagram for illustrating an example of a layout of a circuit substrate 10 on which the semiconductor IC unit is installed. The circuit substrate 10 includes input and output cells P1 to P6, registers F1 to F6 such as flip flop, and logic operation cells W1 to W3, X1 to X3, Y1 to Y3, and Z1 to Z3 which are included in the logic circuit. The input and output cells P1 to P6 input and output signals of the internal circuit of semiconductor IC unit and the circuit substrate 10. The logic operation cells W1 to W3, X1 to X3 and the registers F1 and F4 are included in one logic level block 20 and the logic operation cells Y1 to Y3, Z1 to Z3, and the registers F2, F3, F5, and F6 are included in another logic level block 20.

The input and output cells are connected electrically to logic operation cells and registers which are arranged on the substrate. According to the first embodiment, the input and output cell P2 inputs a signal to the register F2 and the input and output cell P3 inputs a signal to the register F3. Further, the register F4 outputs a signal to the input and output cell P4, the register F5 outputs a signal to the input and output cell P5, and the register F6 outputs a signal to the input and output cell P6. The input and output cell P1 inputs a signal to the logic operation cell W3.

The registers F1 to F6 are connected electrically to the input and output cell P1 to P6, the logic operation cells W1 to W3, X1 to X3, Y1 to Y3, and Z1 to Z3.

A plurality of logic operation cells is arranged between the registers and output and output an input signal from one register to another register. The logic operation cells X1, X2, and X3 are disposed between the registers F1 and F4, and the logic operation cells W1, W2, and W3 are disposed between the registers F4 and F1; Further, the logic operation cells Y1, Y2, and Y3 are disposed between the registers F2 and F5, and the logic operation cells Z1, Z2, and Z3 are disposed between the registers F3 and F6. The logic operation cell Z1 inputs a signal to the logic operation cell Y2, and the logic operation cell Y2 inputs a signal to the logic operation cell X3.

Next, a set of registers (first register according to claims) (hereinafter, "signal-outputting register"), which can supply signals to one logic operation cell directly or via other logic operation cell, is extracted for each logic operation cell and a set of registers (second register according to claims) (hereinafter, "signal-inputting register) to which signals can be supplied directly or via other logic operation cell from the logic operation cell is extracted for each logic operation cell. The input and output cells may be allowed to be the signal-outputting registers and the signal-inputting registers or may be excluded from being any of the two. In the first embodiment, a case where the input and output cells as well are allowed to be the signal-outputting registers or the signal inputting-registers, is described below. Therefore, the input and output cells P1 to P6 as well are allowed to be the signal-outputting registers or the signal-inputting registers.

Since the register F1 may supply a signal to the logic operation cell X1, the register F1 is extracted as the signal-outputting register of the logic operation cell X1 and since the register F4 may be supplied with a signal from the logic operation cell X1, the register F4 is extracted as the signal-inputting register of the logic operation cell X1. Further, since the registers F1, F2, and F3 may supply signals to the logic operation cell 3, the registers F1, F2, and F3 are extracted as the signal-outputting registers of the logic operation cell X3 and since the register F4 may be supplied with a signal from the logic operation cell X3, the register F4 is extracted as the signal-inputting register of the logic operation cell X3. All the logic operation cells are extracted in this manner.

When both the signal-outputting register and the signal-inputting register are in common between one logic operation cell and other logic operation cell, these logic operation cells are created and extracted as one cluster (step S300). For example, the register F3 is a signal-inputting register in common for the logic operation cell Z2 and the logic operation cell Z3, the register F6 is a signal-inputting register in common. Therefore, the logic operation cells Z2 and Z3 are created and extracted as one cluster cell. Similarly, the logic operation cells X1 and X2 and the logic operation cells W1 and W2 are created and extracted as one cluster cell.

For the other logic operation cell, if there is no logic operation cell that is used commonly by both the signal-outputting register and the signal-inputting register, the logic operation cell is an independent cluster. For example, for the logic operation cell X3, since there is no logic operation cell used commonly by both the signal-outputting register and the signal-inputting register, the logic operation cell X3 is an independent cluster.

Next, the registers and the clusters created and extracted are arranged (step S400). Even if the cluster cell which is created and extracted at step S300 is created from a plurality of logic operation cells, it is treated as one cell. Therefore, the logic operation cells W1 and W2, X1 and X2, and Z2 and Z3 which are included in the cluster cell, are arranged closely.

Figure 3:
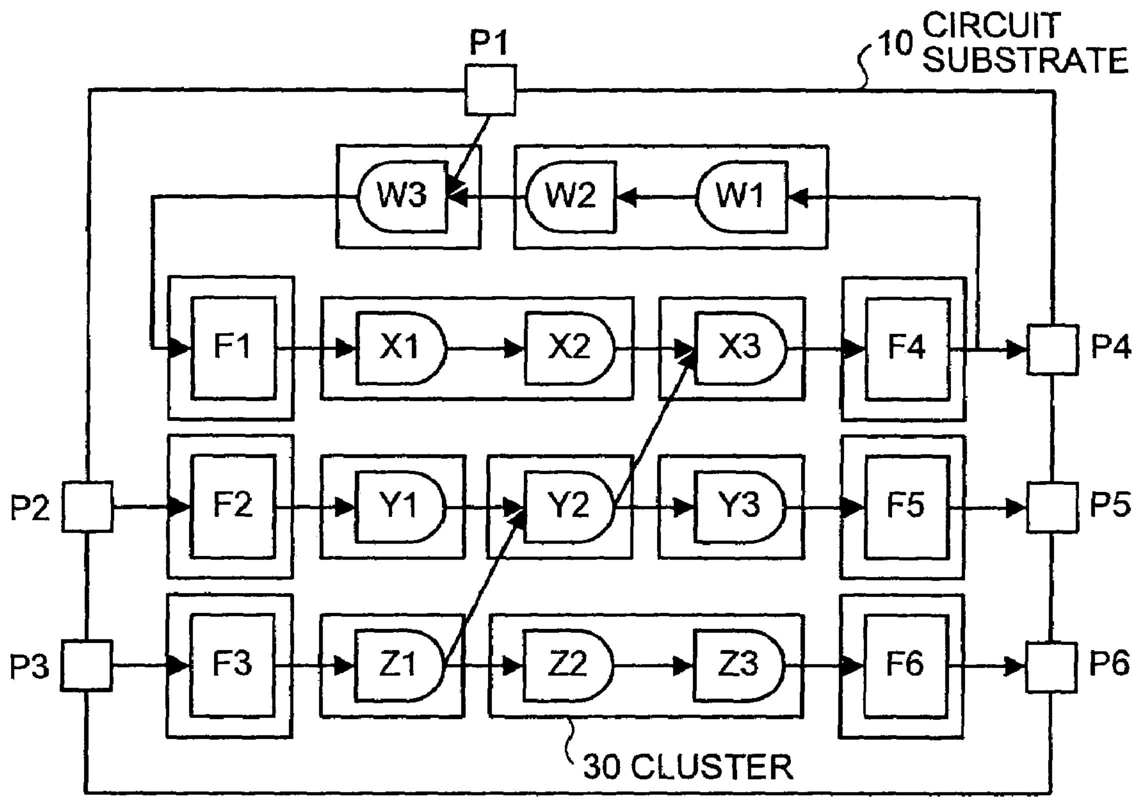
FIG. 3 is a circuit diagram for illustrating a layout of a circuit substrate on which cluster cells and registers are arranged after extracting cluster cells.

FIG. 3 is a circuit diagram for illustrating a layout of the circuit substrate 10 on which the semiconductor IC unit in which the cluster cells and the registers are arranged after creating and extracting the cluster cells. The logic operation cells W1 and W2, X1 and X2, and Z1 and Z2 are included in one cluster cell. The remaining logic operation cells W3, X3, Y1 to Y3, and Z1 are independent cluster cells. The logic operation cells W1 and W2, X1 and X2, and Z1 and Z2 which are included in one cluster cell, are arranged closely.

From such an arrangement, any level block that is to be subjected to the floor plan is selected (step S500). In this case, the logic level block 20 that includes the logic operation cells W1 to W3, X1 to X3, and registers F1 and F4 and another logic level block 20 that includes the logic operation cells Y1 to Y3, Z1 to Z3, and registers F2, F3, F5, and F6 are selected. Generally, it is necessary that the arrangement and wiring area of the level block does not overlap with the arrangement and wiring area of the other block and is in a rectangular shape. Therefore, the arrangement and wiring area is determined such that it can accommodate cells in the respective level blocks (step S600).

Figure 4:
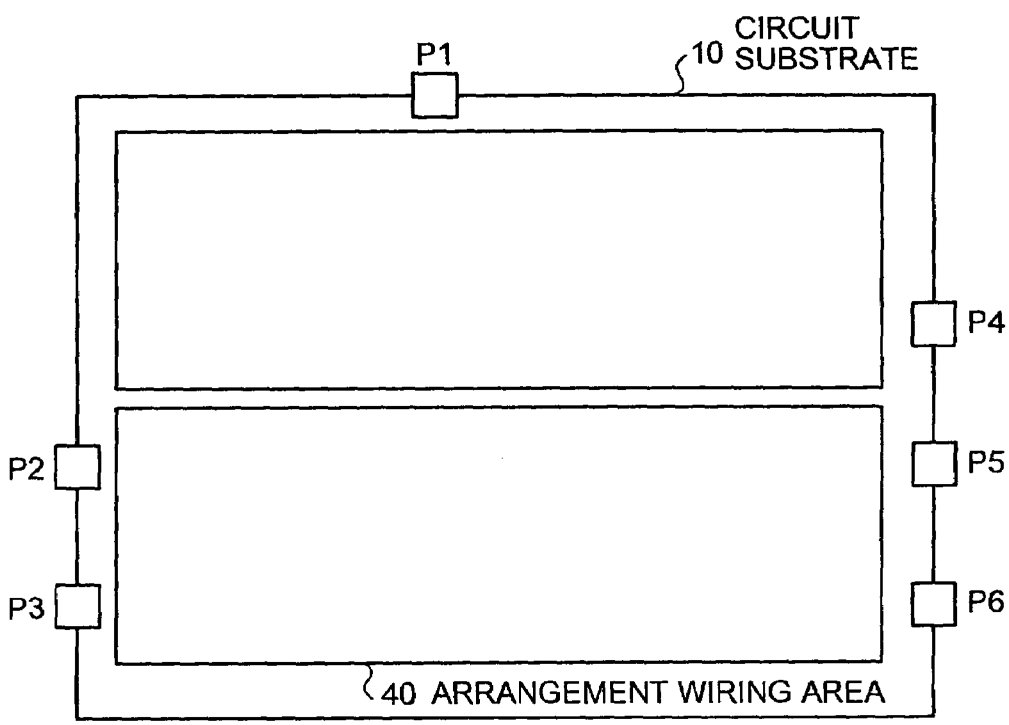
FIG. 4 is a schematic for illustrating an arrangement and wiring area that is determined from an arrangement of the cluster cells and registers shown in FIG. 3.

FIG. 4 is a schematic for illustrating an arrangement and wiring area that is determined from an arrangement of the cluster cells and registers shown in FIG. 3. The arrangement and wiring area is determined such that the level blocks of the logic level block 20 that includes the logic operation cells W1 to W3, X1 to X3, and registers F1 and F2 and the other logic level block 20 that includes the logic operation cells Y1 to Y3, Z1 to Z3, and the registers F2, F3, F5, and F6, become rectangular shape.

Further, in the arrangement and wiring area, the arrangement and wiring, and circuit structure of the cells are optimized (step S700). The arrangement and wiring, and the circuit structure which are obtained, are tested by simulation (step S800), and if they are judged to be optimized, the floor plan is completed. If the arrangement and wiring, and the circuit structure are judged to be not optimized upon simulation, the process returns to any one of steps S400 to S700 and the steps from that particular step onward are repeated.

A relationship of the cluster cells that are created in the logic level block 20 in the circuit-connection information, can be stored in a computer that is used for making the floor plan and can be displayed in a graphic window. For example, the floor plan may be performed such that when the logic level block 20 is selected in the graphic window, the cluster cell is highlighted, and when the cluster cell is selected, the logic level block 20 is highlighted. Further, in the floor plan according to the first embodiment, the desired floor plan may be performed while the designer revises by a manual operation.

Thus, according to the first embodiment, for each logic operation cell, the cluster cell is created and extracted based on the signal-outputting register and the signal-inputting register and the cells are arranged such that the cluster cell is one unit. Therefore, the logic operation cells used commonly by both the signal-outputting register and the signal-inputting register are arranged closely. For this reason, a chip designing that enables high-speed operation in the arrangement and wiring process of the floor plan can be carried out in a short period of time with ease. Further, since the number of cells to be arranged becomes small, the chip designing that enables high-speed operation in the arrangement and wiring process of the floor plan can be carried out in a short period of time with ease.

Figure 5:
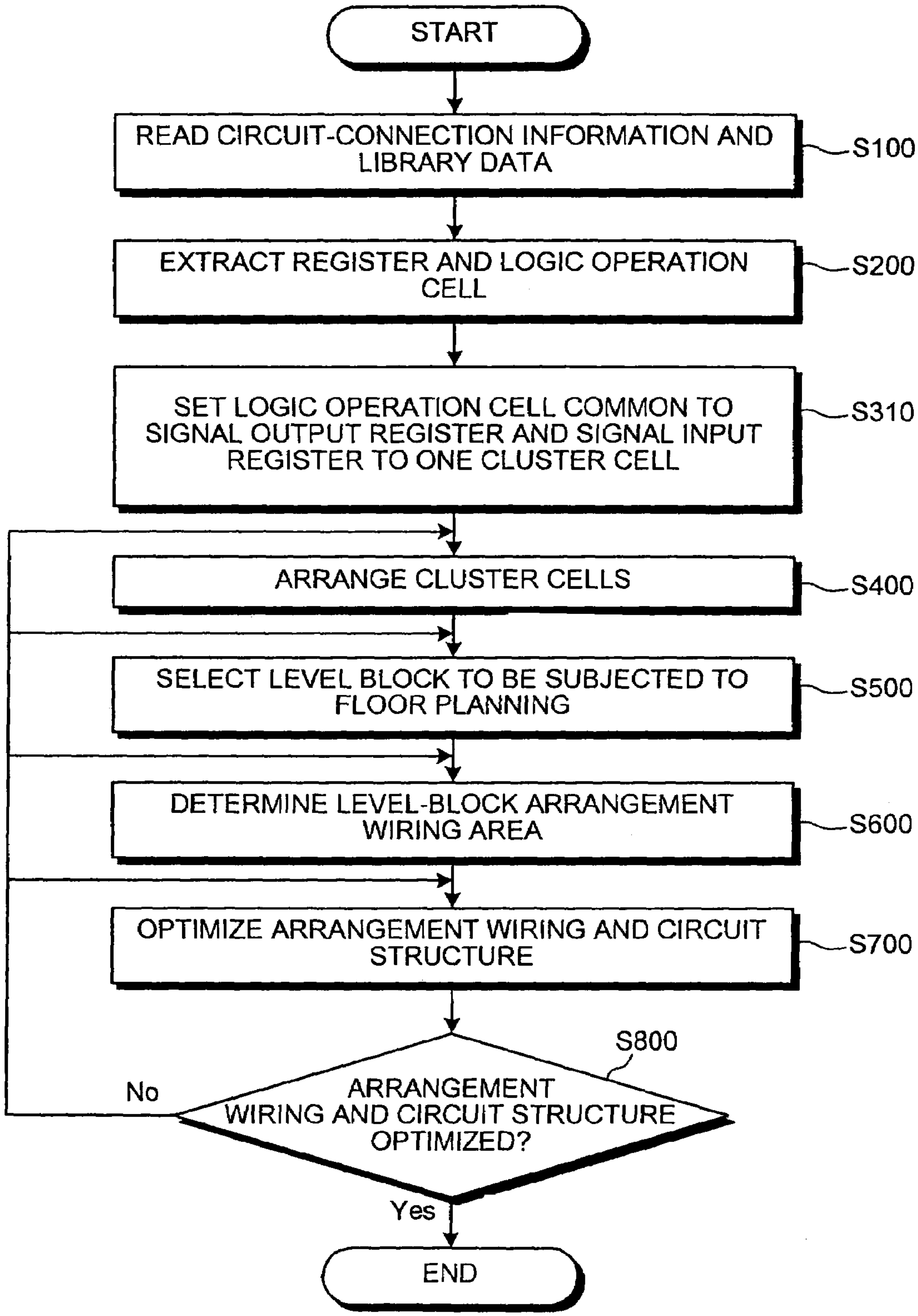
FIG. 5 is a flowchart of an automatic floor-planning process according to a second embodiment of the present invention.

FIG. 5 is a flowchart of an automatic floor-planning process according to a second embodiment of the present invention.

A PC that executes a floor plan reads the circuit-connection information and the library data (step S100) and registers (input and output cells) and logic operation cells are extracted from the circuit-connection information.

Further, the signal-outputting register and the signal-inputting register for each logic operation cell are extracted (step S200). According to the second embodiment, a register and a logic operation cell same as for the semiconductor IC according to the first embodiment in FIG. 2, are extracted.

According to the second embodiment, a sum set of the signal-outputting register and the signal-inputting register for one logic operation cell is taken for each logic operation cell and a logic operation cell which are used commonly by the sum set are created and extracted as one cluster cell (step S310).

For example, the sum set of the signal-outputting register and the signal-inputting register of the logic operation cells W1 and W2 match together at {register F1 and register F4}. Similarly, the sum set of the signal-outputting register and the signal-inputting register of the logic operation cells X1 and X2 match together at {register F1 and register F4}. Therefore, the logic operation cells W1 and W2 form one cluster and the logic operation cells X1 and X2 form another cluster.

Further, the sum set of the signal-outputting register and the signal-inputting register of the logic operation cells Z2 and Z3 match together at {register F3 and register F6}. Therefore, the logic operation cells Z2 and Z3 form one cluster. Next, the floor planning is executed in the same order as in the method of automatic determination of the floor plan according to the first embodiment as shown in FIG. 1 and the floor plan is completed (steps S400 to S800).

Thus, according to the second embodiment, for each logic operation cell, the sum set of the signal-outputting register and the signal-inputting register is taken and the logic operation cells used commonly by this sum set are created and extracted as one cluster. Since the cells are arranged such that this cluster cell is one unit, the logic operation cells which are used commonly by sum set of both the signal-outputting register and the signal-inputting register, are arranged closely. For this reason, the chip designing that enables high-speed operation in the arrangement and wiring process of the floor plan can be carried out in a short period and time with ease. Further, since the number of cells to be arranged becomes small, the chip designing that enables high-speed operation in the arrangement and wiring process of the floor plan can be carried out in a short period of time with ease.

Figure 6:
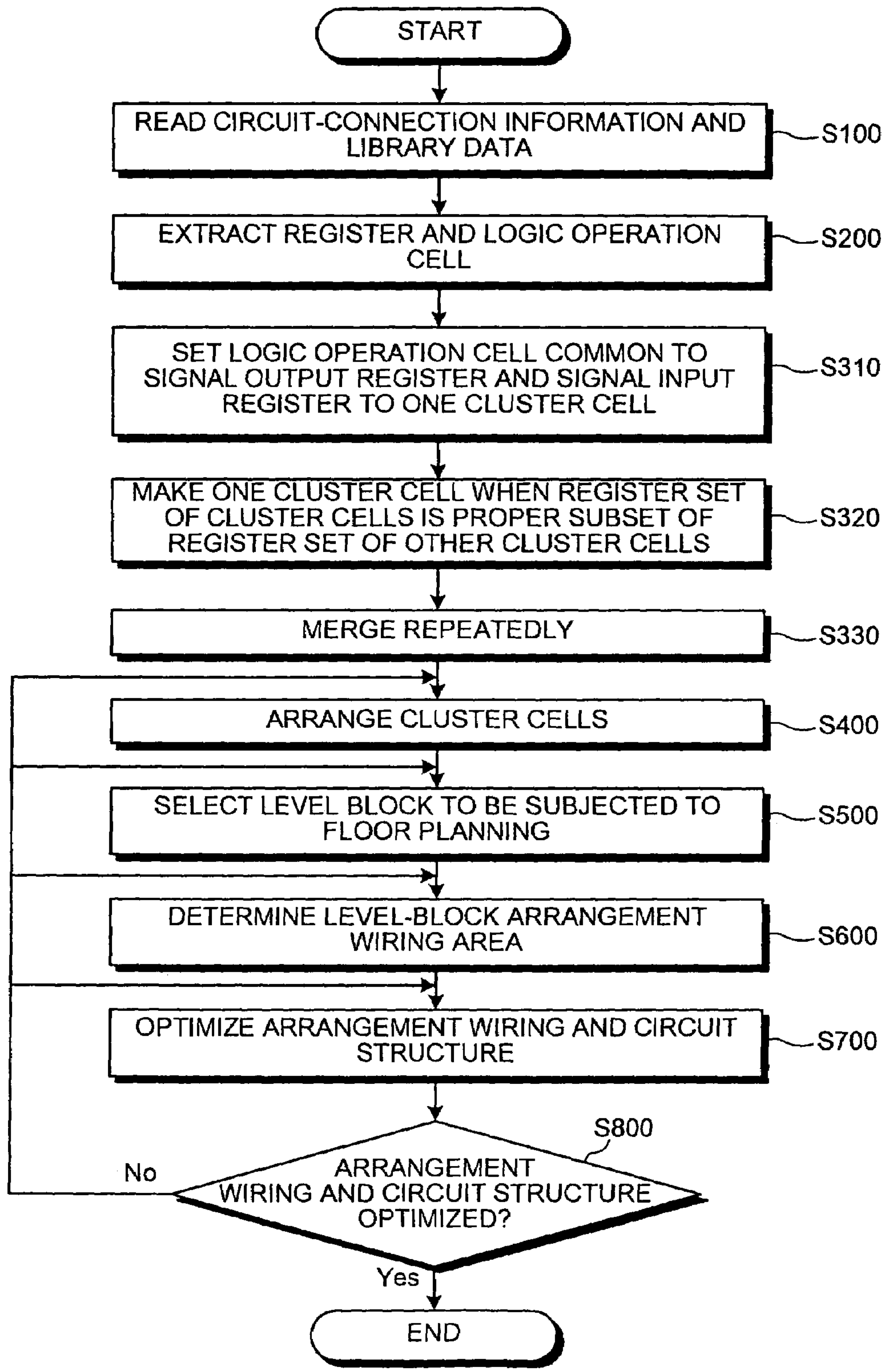
FIG. 6 is a flowchart of an automatic floor-planning process according to a third embodiment of the present invention.

FIG. 6 is a flowchart of an automatic floor-planning process according to a third embodiment of the present invention.

A PC that executes a floor plan reads the circuit-connection information and the library data (step S100) and registers, logic operation cells, and input and output cells are extracted from the circuit-connection information. In the third embodiment, unlike in the first embodiment, a case in which the input and output cells are not allowed to be the signal-outputting registers and the signal-inputting registers, is described. Further, the signal-inputting register and the signal-outputting register for each logic operation cell, are extracted (step S200). According to the third embodiment, a register and a logic operation cell same as those for the semiconductor IC according to the first embodiment in FIG. 2, are extracted.

According to the third embodiment, the sum set of the signal-outputting register and the signal-inputting register for one logic operation cell is taken for each logic operation cell and logic operation cells used commonly by the sum set are created and extracted as one cluster cell (step S310). Further, when this sum set is allowed to be a register set of the cluster cell, if a register set of a certain cluster cell becomes a proper subset of a register set of another cluster cell, these two cluster cells are merged to form one cluster cell (step S320).

For example, the logic operation cells W1 and W2 have the signal-outputting register in common at the register F1 and the signal-inputting register in common at the register F4, and the sum set of the signal-outputting register and the signal-inputting register is {register F1 and register F4}. Therefore, the register set of the cluster cells that include the logic operation cells W1 and W2 is {register F1 and register F4}.

The logic operation cell X1 and the logic operation cell X2 have the signal-outputting register in common at the register F4 and the signal-inputting register in common at the register F1, and the sum set of the signal-outputting register and the signal-inputting register is {register F1 and register F4}. Therefore, the register set of the cluster cells that include the logic operation cell X1 and X2, is {register F1 and register F4}.

On the other hand, the logic operation cell X3 has the registers F1, F2, F3 as the signal-outputting registers and the register F4 as the signal-inputting register. Further, the sum set of signal-outputting register and the signal-inputting register is {register F1, register F2, register F3, register F4} and the register of the cluster cells is {register F1, register F2, register F3, register F4} as well.

Thus, the register set of the clusters that include the logic operation cells W1 and W2 and the clusters that include the logic operation cells X1 and X2 is a proper subset of the register set of the clusters that include the logic operation cell X3. Therefore, the cluster cell that includes the logic operation cells W1 and W2 and the cluster cell that includes the logic operation cells X1 and X2, are merged with the cluster cell that includes the logic operation cell X3 to form one cluster cell that includes the logic operation cells W1, W2, and X1 to X3. Similarly, the logic operation cells Y1, Y2 form one cluster cell and the logic operation cells Z1, Z2, and Z3 form another cluster cell.

In this case, for example, the logic operation cells W1 to W3, X1, and X2 may be allowed to be one cluster cell and the logic operation cell X3 may be allowed to be another cluster cell. Next, the floor planning is executed in the same order as in the method of automatic determination of the floor plan according to the first embodiment as shown in FIG. 1 and the floor plan is completed (steps S400 to S800).

Figure 7:
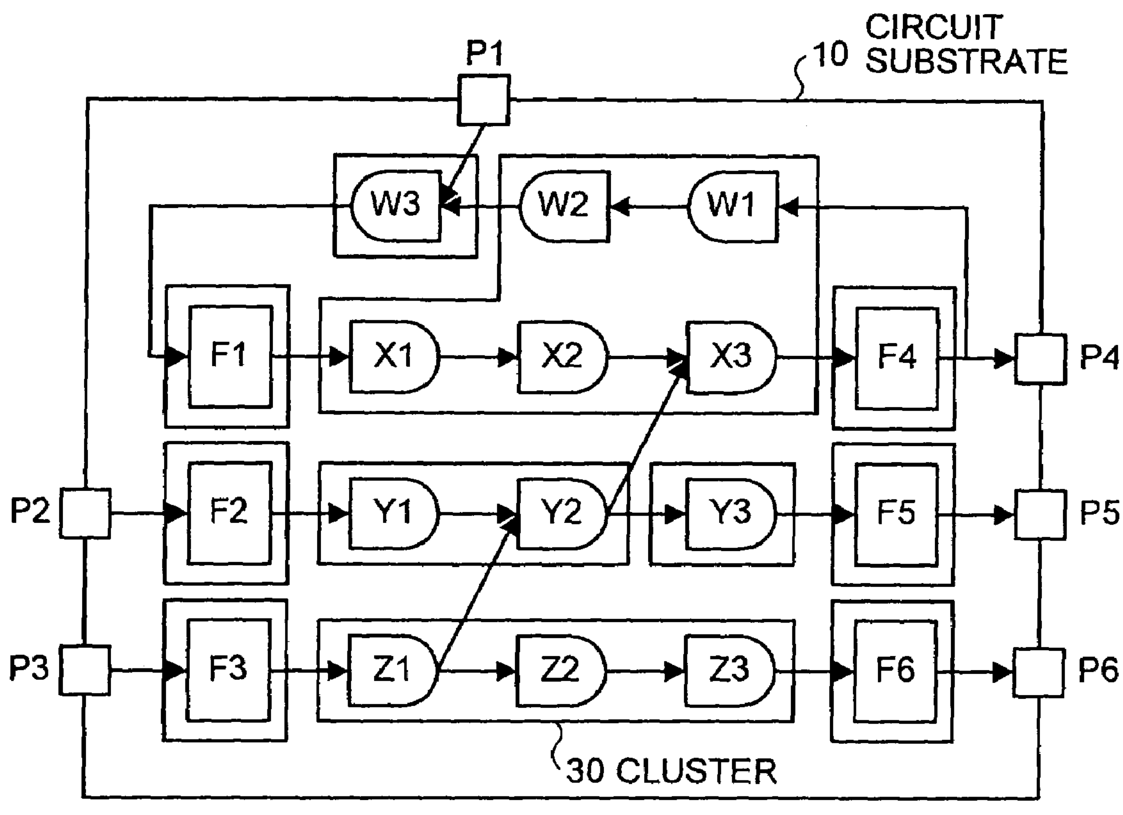
FIG. 7 is a circuit diagram for illustrating a layout of a circuit substrate after extracting cluster cells according to the third embodiment.

FIG. 7 is a circuit diagram for illustrating a layout of a circuit substrate 10 on which a semiconductor IC in which the cluster cells and registers obtained by a method of creation and extraction of the cluster cells according to the third embodiment are arranged, is installed.

The logic operation cells W1, W2, and X1 to X3 form one cluster cell. Further, the logic operation cells Y1, Y2 form another cluster cell. The logic operation cells W3 and Y3 are independent cluster cells. Therefore, the logic operation cells W1, W2, and X1 to X3 which form one cluster cell are arranged closely. Similarly, the logic operation cells Y1 and Y2 which form another cluster cell and the logic operation cells Z1 to Z3 which form still another cluster cell are arranged closely. The cells may be merged by repeating step 5320. (step S330).

The register set of the cluster cells that include the logic operation cells W1, W2, and X1 to X3 is {register F1, register F2, register F3, register F4} and the register set of the cluster cells that include the logic operation cell W3 is {register 1 and register 4}. Therefore, the register set of the cluster cells that include the logic operation cell W3 is a subset of the register set of the cluster cells that include the logic operation cells W1, W2, and X1 to X3 and the logic operation cells W1 to W3 and X1 to X3 form one cluster cell. Similarly, the logic operation cells Y1 to Y3 form one cluster cell and the logic operation cells Z1 to Z3 form another cluster cell.

Figure 8:
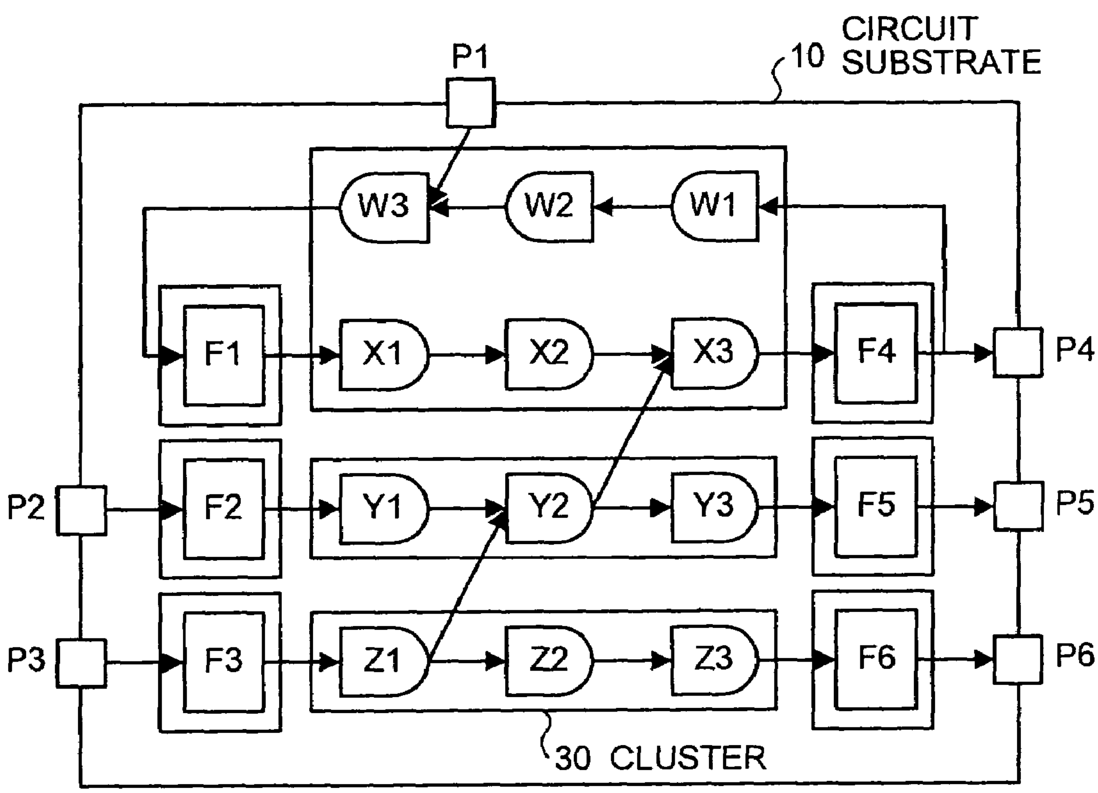
FIG. 8 is another circuit diagram for illustrating a layout of the circuit substrate after extracting cluster cells according to the third embodiment.

FIG. 8 is another circuit diagram of a layout of a circuit substrate 10 on which the semiconductor IC unit in which the cluster cells and registers obtained by the method of creation and extraction of cluster cells according to the third embodiment are arranged, is installed.

According to FIG. 8, the logic operation cells W1 to W3 and X1 to X3 form one cluster cell. Therefore, the logic operation cells W1 to W3 and X1 to X3 which form the cluster cell are arranged close to each other. Further, the logic operation cells Y1 to Y3 which form one cluster cell are arranged close to each other and the logic operation cells Z1 to Z3 which form one cluster cell are arranged close to each other. Next, the floor planning is executed in the same order as in the method of automatic determination of the floor plan according to the first embodiment as shown in FIG. 1 and the floor plan is completed (steps S400 to S800).

Thus, according to the third embodiment, the sum set of the signal-outputting register and the signal-inputting register for one logic operation cell is taken and logic operation cells which are used commonly by the sum set are created and extracted as one cluster cell. Further, when the sum set is allowed to be a register set of the cluster cell, if a register set of a certain cluster cell becomes a proper subset of a register set of another cluster cell, these two cluster cells are merged to form one cluster cell. Therefore, since the logic operation cells that form one cluster cell are arranged closely, the chip designing that enables high-speed operation in the arrangement and wiring process of the floor plan can be carried out in a short period of time with ease. Further, since the number of cells to be arranged becomes small, the chip designing that enables high-speed operation in the arrangement and wiring process of the floor plan can be carried out in a short period of time with ease.

Figure 9:
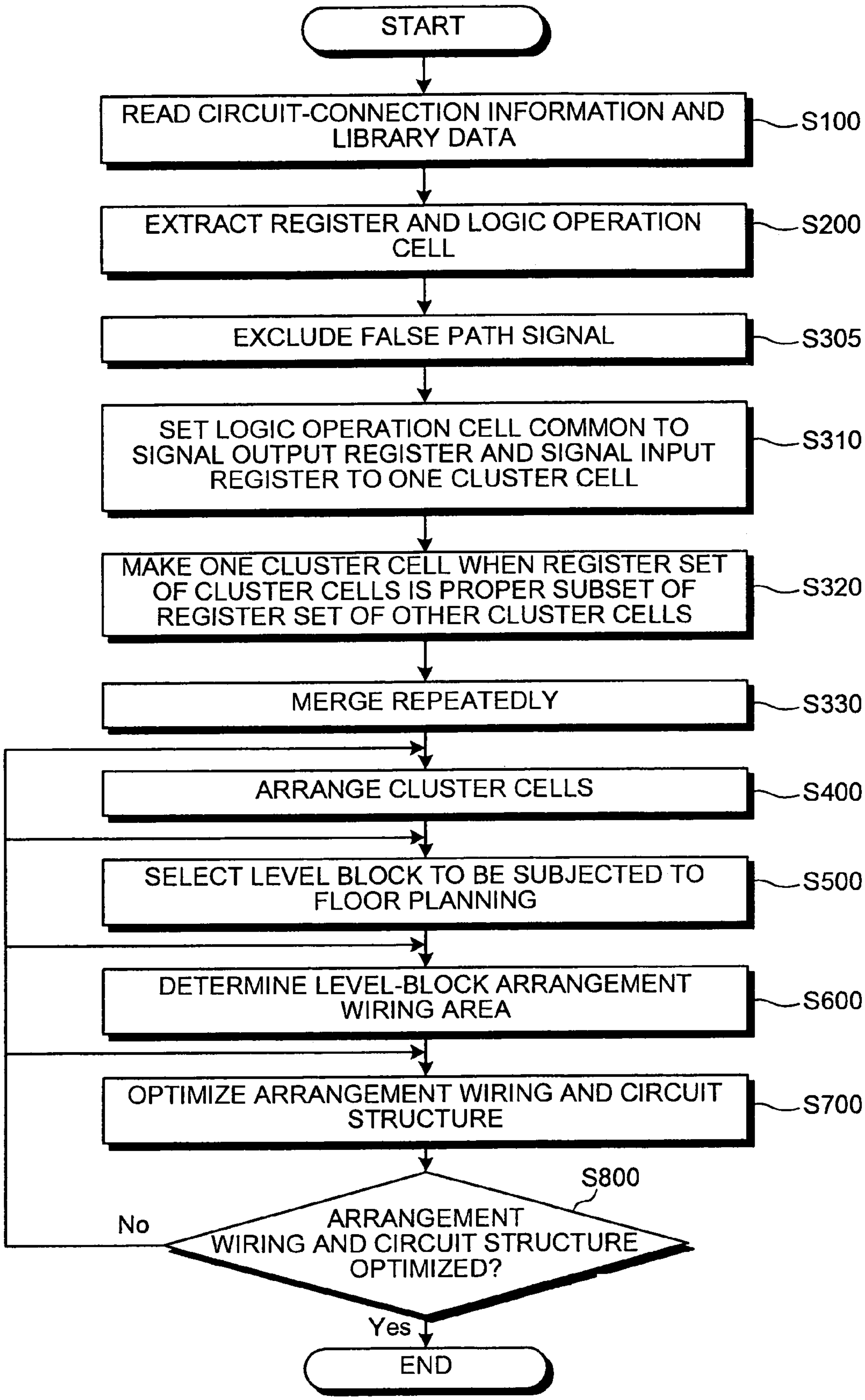
FIG. 9 is a flowchart of an automatic floor-planning process according to a fourth embodiment of the present invention.

FIG. 9 is a flowchart of an automatic floor-planning process according to a fourth embodiment of the present invention.

A PC that executes a floor plan reads the circuit-connection information and the library data (step S100) and registers, logic operation cells, and input and output cells are extracted from the circuit-connection information. In the third embodiment, similarly as in the first embodiment, a case in which the input and output cells are allowed to be the signal-outputting registers and the signal-inputting registers, is described. Further, the signal-outputting register and the signal-inputting register for each logic operation cell are extracted (step S200).

In the fourth embodiment, the register cells and the logic operation cells same as in the semiconductor IC unit according to the first embodiment shown in FIG. 2, are allowed to be extracted. According to the fourth embodiment, the sum is calculated by excluding a false path for which a signal-propagation speed in the connection circuit need not be taken into consideration.

For example, let a signal from the register F3 to register F6 be a false path. In this case, a signal connection in the false path is considered not to be connected, and excluded (step S305). Since the signal from the register F3 to register F6 is a false path, a signal from the logic operation cell Z1 to the logic operation cell Z2, a signal from the logic operation cell Z2 to the logic operation cell Z3, and a signal from the logic operation cell Z3 to the register F6 are treated as if they are not there.

In this case, signals that may be transmitted through the logic operation cell Z1 are a signal that is transmitted from the register F3 to the register F5 via the logic operation cells Z1, Y2, and Y3 and a signal that is transmitted from the register F3 to register F4 via the logic operation cells Z1, Y2, and X3. Therefore, the signal-outputting register for the logic operation cell Z1 becomes the register F3 and the signal-inputting register for the logic operation cell Z1 becomes the registers F4 and F5. Further, the sum set of the signal-inputting register and the signal-outputting register of the logic operation cell X3 is {register F3, register F4, register F5}.

In such a case, the cluster cells are created by the same procedure as in the third embodiment. The sum set of the signal-outputting register and the signal-inputting register is taken for each logic operation cell and logic operation cells which are used commonly by the sum set are created and extracted as one cluster cell (step S310). Further, when this sum set is allowed to be a register set of the cluster cell, if a register set of a certain cluster cell becomes a proper subset of a register set of another cluster cell, these two cluster cells are merged to form one cluster cell (step S320). Further, the cells are merged by repeating step S320 (step S330).

Figure 10:
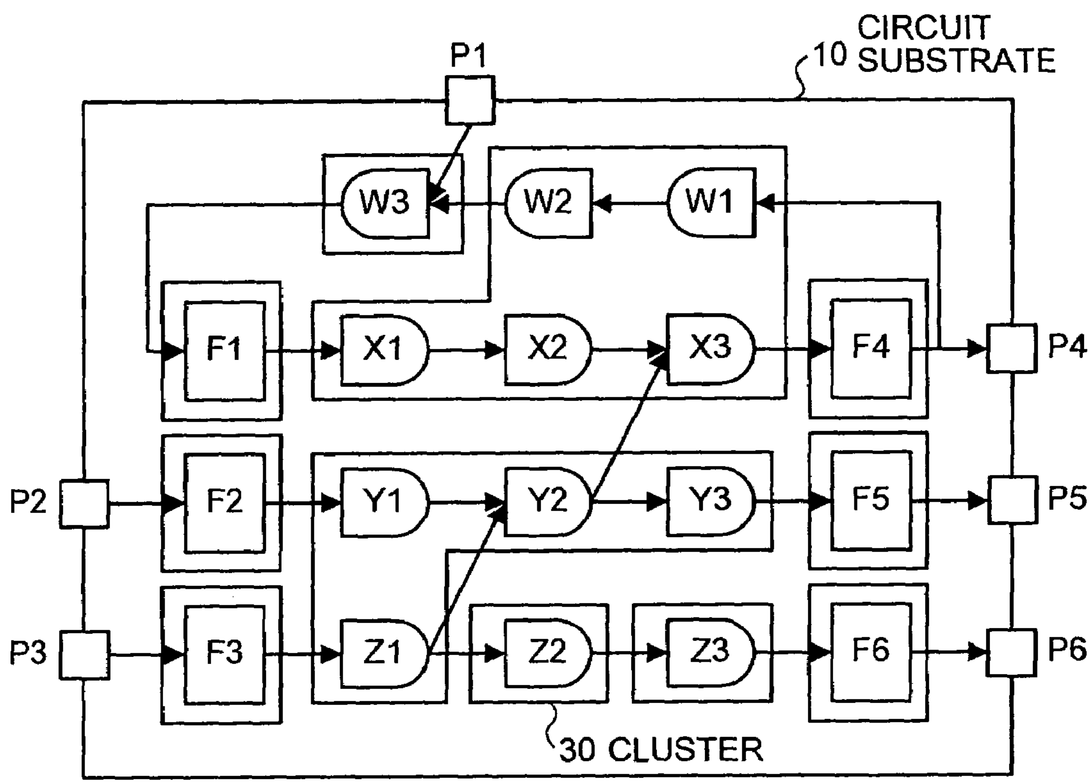
FIG. 10 is a circuit diagram for illustrating a layout of a circuit substrate after extracting cluster cells according to the fourth embodiment.

FIG. 10 is a circuit diagram for illustrating a layout of a circuit substrate on which the semiconductor IC unit, in which the cluster cells and registers obtained by the method of creation and extraction of cluster cells according to the fourth embodiment are arranged, is installed.

According to FIG. 10, the logic operation cells Y1 to Y3 and Z1 form one cluster cell. Therefore, the logic operation cells Y1 to Y3 and Z1 which from the cluster cell are arranged close to each other. Further, each of the logic operation cells Z2 and Z3 form an individual cluster cell. Moreover, the logic operation cells W1, W2, and X1 to X3 form one cluster cell and the logic operation cells W1, W2, and X1 to X3 which form the cluster cell are arranged close to each other. Next, the floor planning is executed in the same order as in the automatic floor-planning method according to the first embodiment as shown in FIG. 1 and the floor plan is completed (steps S400 to S800).

Thus, according to the fourth embodiment, since the cluster cells are created by considering the signal connection in the false path as not to be connected, logic operation cells that are connected by a signal wire for which the timing is required be taken into consideration, form one cluster cell. Therefore, the cluster cells for which the timing is not required to be taken into consideration are arranged closely. Therefore, the chip designing that enables high-speed operation in the arrangement and wiring process of the floor plan can be carried out in a short period of time with ease. Further, since the number of cells to be arranged becomes small, the chip designing that enables high-speed operation in the arrangement and wiring process of the floor plan can be carried out in a short period of time with ease.

Figure 11:
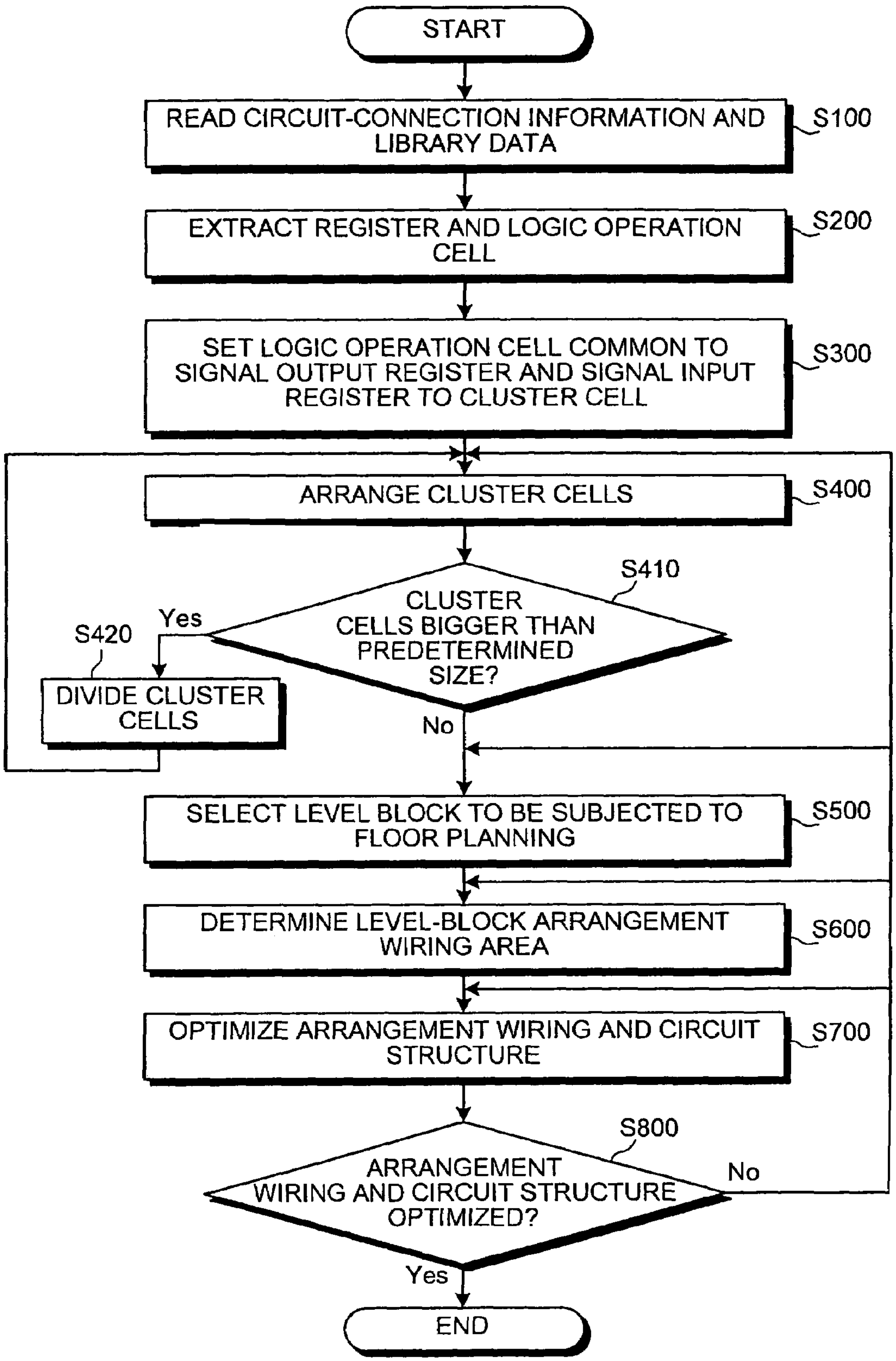
FIG. 11 is a flowchart of an automatic floor-planning process according to a fifth embodiment of the present invention.

FIG. 11 is a flowchart of an automatic floor-planning process according to a fifth embodiment of the present invention.

A PC that executes a floor plan reads the circuit-connection information and the library data (step S100) and registers and logic operation cells are extracted from the circuit-connection information. Further, the signal-outputting register and signal-inputting register for each logic operation cell are extracted (step S200). In the fourth embodiment, the register cells and the logic operation cells same as those in the semiconductor IC unit according to the first embodiment in FIG. 2, are allowed to be extracted.

According to the fifth embodiment, as described in the first embodiment, for other logic operation cell, logic cells which are used commonly by both the signal-outputting register and the signal-inputting register are created and extracted as one cluster cell (step S300).

Further, the cluster cells and the register which are created and extracted are arranged (step S400). While arranging, an upper limit on the total size of the logic operation cells that form the cluster cell is set (step S410) and logic operation cells in the cluster cell crossing the upper limit are divided (step S420). The division of the logic operation cells is determined depending on near which register the logic operation cells in the cluster cell are to be arranged.

For example, division of the cluster cell when the total size of the cluster cell that is formed by the logic cells W1 to W3 and X1 to X3 shown in FIG. 8 is greater than the predetermined upper limit, is described below. For example, if the logic operation cells W3, X1, and X2 are selected as logic operation cells that are to be arranged near the register F1 and the logic operation cells W1, W2, and X3 are selected as logic operation cells that are to be arranged near the register F4, then the cluster cell can be divided into two cluster cells viz. the cluster cell formed by the logic operation cells W3, X1, and X2 and the cluster cell formed by the logic operation cells W1, W2, and X3. Further, the cluster cells and registers that are created and extracted are rearranged (step S400).

A method of extraction of the cluster cell according to the fifth embodiment is not limited to the method of creation and extraction of the cluster cell described in the first embodiment and the cluster cell may be created and extracted by the methods of creation and extraction of the cluster cell described in the second, third, and fourth embodiments. Next, the floor planning is executed in the same order as in the method of automatic determination of the floor plan according to the first embodiment as shown in FIG. 1 and the floor plan is ended (step S500 to S800).

At step S400, a limit may be imposed such that the cluster cell of a size bigger than the predetermined size is not created. By doing so, there is not need to perform processes of division of the cluster cell and rearrangement after the division of the cluster cell.

Thus, according to the fifth embodiment, the upper limit is set on the total size of the logic operation cells that form the cluster cell that is created and extracted and the cluster cell of a size bigger than the predetermined size is divided based on a positional relationship with the register. Therefore, the size of the cluster cell that is created and extracted, is maintained to be an average size and the cluster cells and the registers can be arranged with ease. This enables to shorten the time for obtaining the floor plan and the time for designing of the semiconductor IC unit. Further, since the number of cells to be arranged becomes small, the chip designing that enables high-speed operation in the arrangement and wiring process of the floor plan can be carried out in a short period of time and with ease.

Thus, according to the present invention, the logic operation cells which are used commonly by the signal-outputting register and the signal-inputting register are arranged closely to form one cluster cell. Therefore, the chip designing that enables high-speed operation in the arrangement and wiring process of the floor plan can be carried out in a short period of time and with ease. Further, since the number of cells to be arranged becomes small, the chip designing that enables high-speed operation in the arrangement and wiring process of the floor plan can be carried out in a short period of time and with ease.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An automatic floor-planning method comprising:

extracting a register and a logic operation cell in a semiconductor integrated-circuit unit to be designed;

extracting a first register set that is assumed to input a signal to the logic operation cell directly or via another logic operation cell and a second register set that is assumed to receive a signal from the logic operation cell directly or via the other logic operation cell;

creating a set of the logic operation cells as a cluster cell, based on extracting the first register set and the second register set, wherein the creating includes creating a set of the logic operation cells common to the first register set and the second register set as one cluster cell;

determining layout of the cluster cell and the register such that the logic operation cells in the cluster cell are arranged closely;

selecting a logic level block, for which a floor plan is performed, from among arbitrary logic level blocks that are formed by a set of the register and the logic operation cells in the semiconductor integrated-circuit unit; and determining an arrangement and a wiring area, based on the selecting, such that the arrangement and the wiring area of the logic level block selected includes as many cells as possible that belong to the logic level block.

2. The automatic floor-planning method according to claim 1, wherein the creating includes limiting total size of the logic operation cells included in the cluster cell to no more than a predetermined size.

3. The automatic floor-planning method according to claim 1, wherein the extracting the first register set and the second register set includes extracting the first register set and the second register set while excluding a signal for which it is not necessary to consider propagation speed of the signal during a circuit connection.

4. The automatic floor-planning method comprising:

extracting a register and a logic operation cell in a semiconductor integrated-circuit unit to be designed;

extracting a first register set that is assumed to input a signal to the logic operation cell directly or via another logic operation cell and a second register set that is assumed to receive a signal from the logic operation cell directly or via the other logic operation cell;

creating a set of the logic operation cells as a cluster cell, based on extracting the first register set and the second register set, wherein the creating includes obtaining a sum set of the first register set and the second register set for each of the logic operation cells, and creating, if a sum set of the first register set and the second register set for a logic operation cell is a proper subset of the sum set of the first register set and the second register set for another logic operation cell, a set of the logic operation cells as one cluster cell;

determining a layout of the cluster cell and the register such that the logic operation cells in the cluster cell are arranged closely;

selecting a logic level block, for which a floor plan is performed, from among arbitrary logic level blocks that are formed by a set of the register and the logic operation cells in the semiconductor integrated-circuit unit; and determining an arrangement and wiring area, based on the selecting, such that the arrangement and wiring area of the logic level block selected includes as many cells as possible that belong to the logic level block.

5. The automatic floor-planning method according to claim 4, wherein the creating includes, if a sum set of one cluster cell is in a relation of a proper subset with a sum set of the another cluster cell or a sum set of the logic operation cell, repeating a process of creating one cluster cell by puffing together the one cluster cell with the other cluster cell or the logic operation cell.

6. The automatic floor-planning method according to claim 4, wherein the extracting the first register set and the second register set includes extracting the first register set and the second register set while excluding a signal for which it is not necessary to consider propagation speed of the signal during a circuit connection.

7. The automatic floor-planning method according to claim 4, wherein the creating includes limiting total size of the logic operation cells included in the cluster cell to no more than a predetermined size.

8. The automatic floor-planning method according to claim 4, comprising:

dividing, if a total size of the logic operation cells included in the cluster cell is bigger than a predetermined size, the cluster cell; and re-determining the layout of the cluster cell and the register such that the logic operation cells in the cluster cell are arranged closely, wherein the dividing and the re-determining intervene between the determining layout and the selecting.

9. The automatic floor-planning method according to claim 8, wherein the dividing includes dividing the cluster cell based on a positional relation of the register and the cluster cell arranged at the determining.

10. An automatic floor-planning method comprising:

extracting a register and a logic operation cell in a semiconductor integrated-circuit unit to be designed;

extracting a first register set that is assumed to input a signal to the logic operation cell directly or via another logic operation cell and a second register set that is assumed to receive a signal from the logic operation cell directly or via the other logic operation cell;

creating a set of the logic operation cells as a cluster cell, based on extracting the first register set and the second register set;

determining a layout of the cluster cell and the register such that the logic operation cells in the cluster cell are arranged closely;

selecting a logic level block, for which a floor plan is performed, from among arbitrary logic level blocks that are formed by a set of the register and the logic operation cells in the semiconductor integrated-circuit unit;

determining an arrangement and wiring area, based on the selecting, such that the arrangement and wiring area of the logic level block selected includes as many cells as possible that belong to the logic level block;

dividing, if a total size of the logic operation cells included in the cluster cell is bigger than a predetermined size, the cluster cell; and re-determining the layout of the cluster cell and the register such that the logic operation cells in the cluster cell are arranged closely, wherein the dividing and the re-determining intervene between the determining layout and the selecting.

11. The automatic floor-planning method according to claim 10, wherein the extracting the first register set and the second register set includes extracting the first register set and the second register set while excluding a signal for which it is not necessary to consider propagation speed of the signal during a circuit connection.

12. The automatic floor-planning method according to claim 10, wherein the dividing includes dividing the cluster cell based on a positional relation of the register and the cluster cell arranged at the determining.

13. The automatic floor-planning method according to claim 10, wherein the creating, the determining, and the re-determining include storing a relation between the logic level block and the cluster cell;

displaying the logic level block and the cluster on a display; and highlighting on the display, when either of the logic level block and the cluster cell on the display is selected, the logic level block or the cluster cell that is not selected.

14. The automatic floor-planning method according to claim 10, wherein the creating includes creating a set of the logic operation cells common to the first register set and the second register set as one cluster cell.

* * * * *